(12) United States Patent
Fuergut et al.

(10) Patent No.: US 11,942,383 B2
(45) Date of Patent: Mar. 26, 2024

(54) LINEAR SPACER FOR SPACING A CARRIER OF A PACKAGE

(71) Applicant: Infineon Technologies AG, Neubiberg (DE)

(72) Inventors: Edward Fuergut, Dasing (DE); Chii Shang Hong, Melaka (MY); Teck Sim Lee, Melaka (MY); Ralf Otremba, Kaufbeuren (DE); Daniel Pedone, Munich (DE); Bernd Schmoelzer, Radenthein (AT)

(73) Assignee: Infineon Technologies AG, Neubiberg (DE)

( * ) Notice: Subject to any disclaimer, the term of this patent is extended or adjusted under 35 U.S.C. 154(b) by 295 days.

(21) Appl. No.: 17/501,568

(22) Filed: Oct. 14, 2021

(65) Prior Publication Data

US 2022/0148934 A1 May 12, 2022

(30) Foreign Application Priority Data

Nov. 9, 2020 (DE) ..................... 10 2020 129 423.9

(51) Int. Cl.
| | |
|---|---|
| *H01L 23/16* | (2006.01) |
| *H01L 21/48* | (2006.01) |
| *H01L 21/56* | (2006.01) |
| *H01L 23/31* | (2006.01) |
| *H01L 23/367* | (2006.01) |

(52) U.S. Cl.
CPC .......... *H01L 23/16* (2013.01); *H01L 21/4871* (2013.01); *H01L 21/565* (2013.01); *H01L 23/3114* (2013.01); *H01L 23/3672* (2013.01)

(58) Field of Classification Search
CPC . H01L 23/16; H01L 23/3114; H01L 23/3672; H01L 21/4871; H01L 21/565
See application file for complete search history.

(56) References Cited

U.S. PATENT DOCUMENTS

| | | | |
|---|---|---|---|
| 6,627,976 B1 | 9/2003 | Chung et al. | |
| 2001/0040300 A1* | 11/2001 | Huang | ..................... H01L 24/32 257/E23.092 |
| 2003/0058620 A1 | 3/2003 | Rumer et al. | |
| 2003/0065453 A1 | 4/2003 | Johansson | |
| 2005/0104168 A1* | 5/2005 | Choi | ..................... H01L 23/315 257/E23.128 |
| 2008/0158843 A1 | 7/2008 | So et al. | |
| 2008/0303130 A1* | 12/2008 | Chen | ..................... H01L 25/105 257/696 |
| 2015/0319886 A1 | 11/2015 | Albrecht, III et al. | |
| 2019/0067154 A1* | 2/2019 | Yoshihara | ............... H01L 23/29 |

FOREIGN PATENT DOCUMENTS

| | | |
|---|---|---|
| DE | 10 2017 128 928 | 8/2019 |
| EP | 2053654 | 4/2009 |
| JP | H10261744 | 9/1998 |

\* cited by examiner

*Primary Examiner* — Peniel M Gumedzoe
(74) *Attorney, Agent, or Firm* — Dicke, Billig & Czaja, PLLC

(57) ABSTRACT

A package for mounting on a mounting base is disclosed. In one example, the package comprises a carrier, an electronic component mounted at the carrier, leads electrically coupled with the electronic component and to be electrically coupled with the mounting base, and a linear spacer for defining a spacing with respect to the carrier.

15 Claims, 7 Drawing Sheets

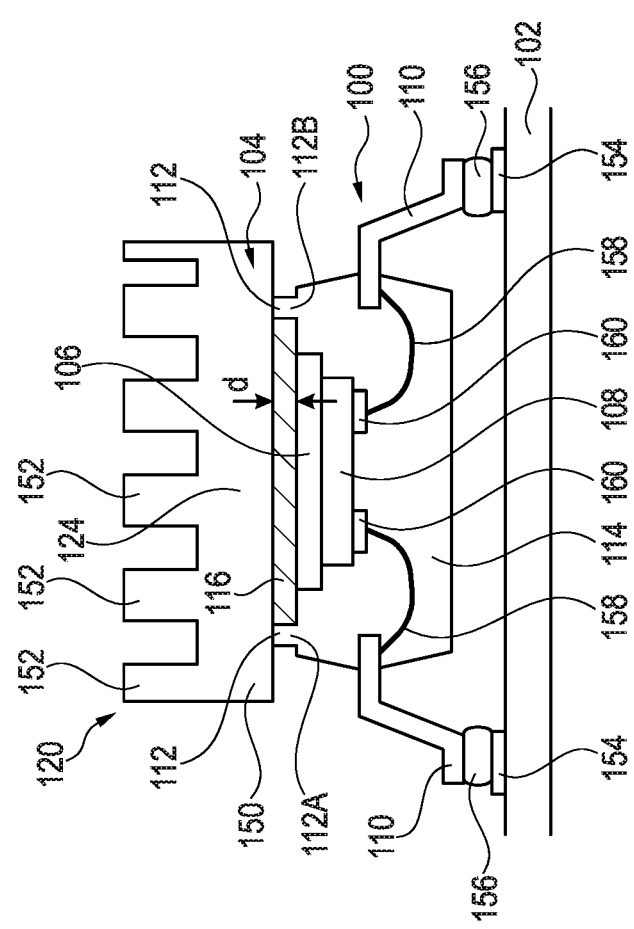
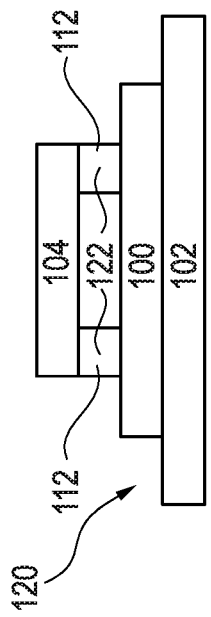
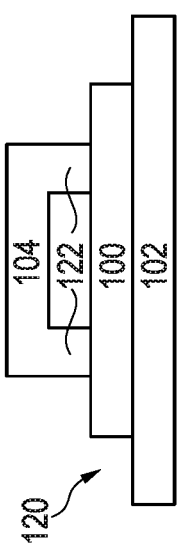
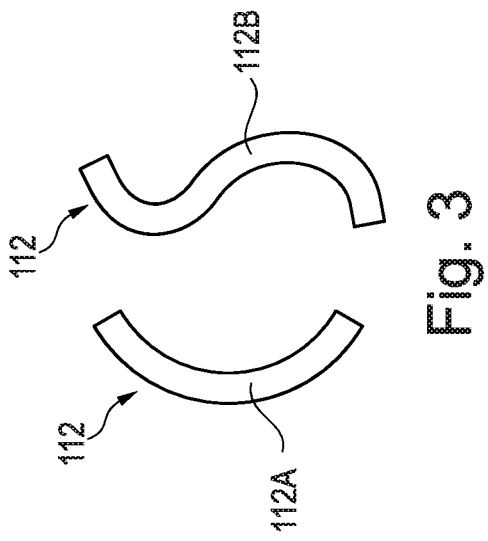
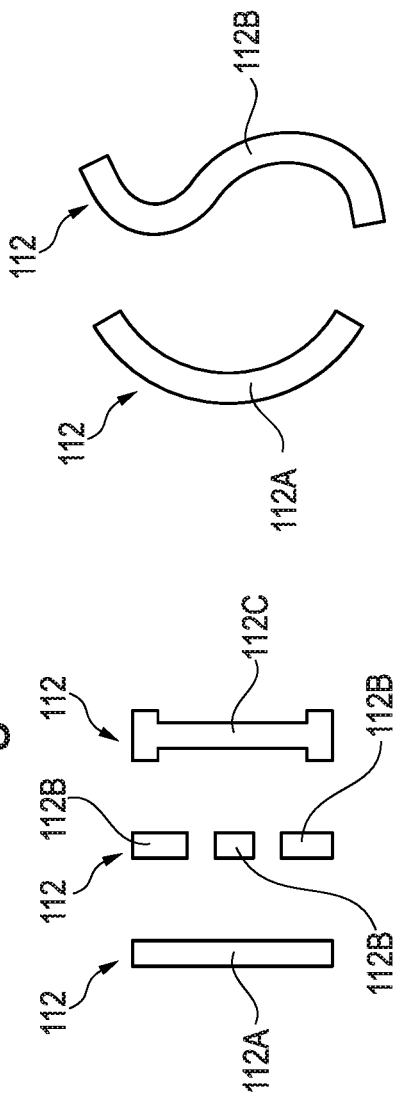

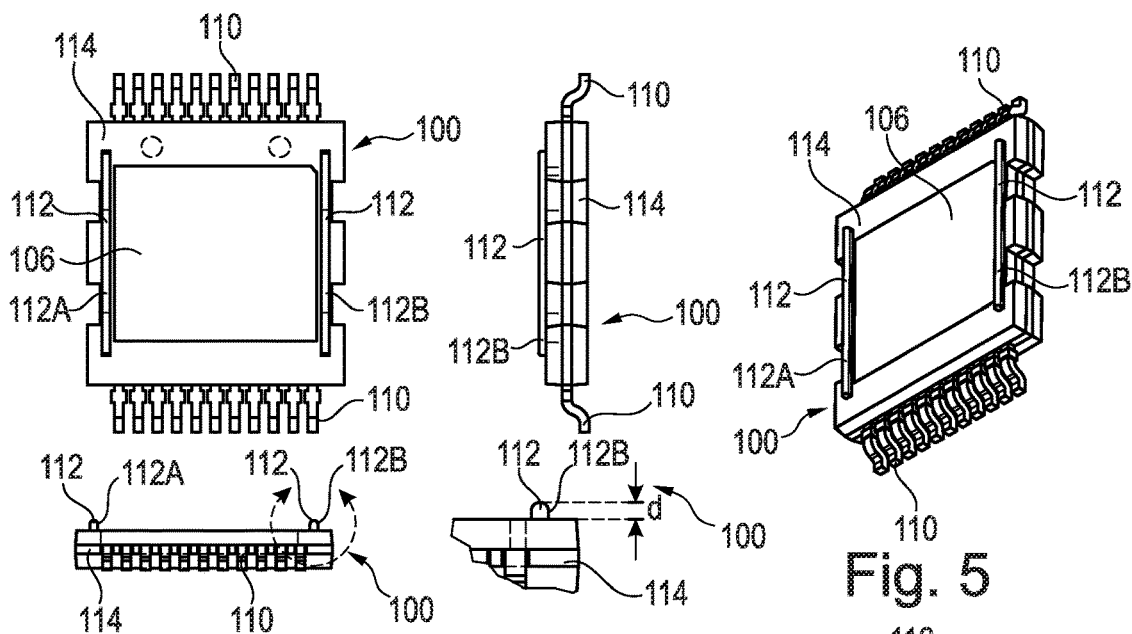
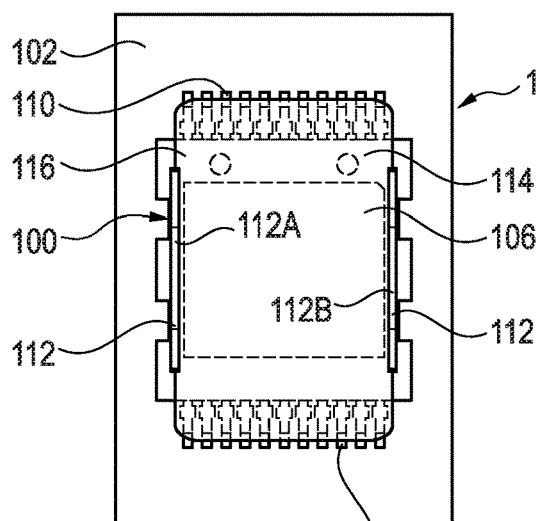
Fig. 6
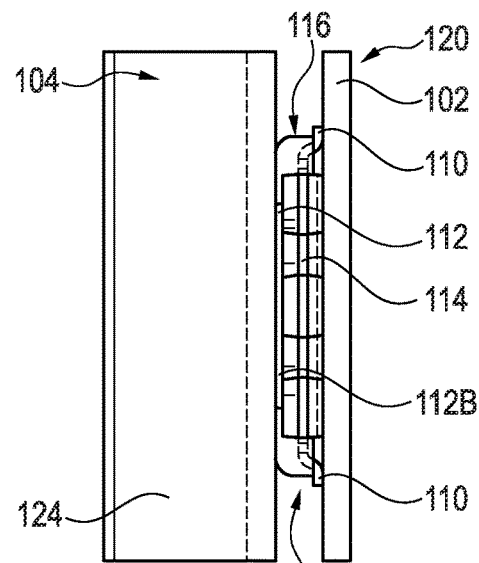
Fig. 7
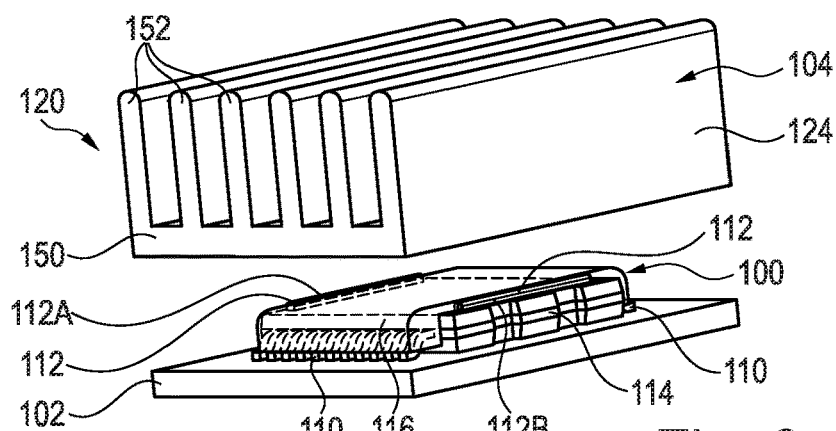
Fig. 8

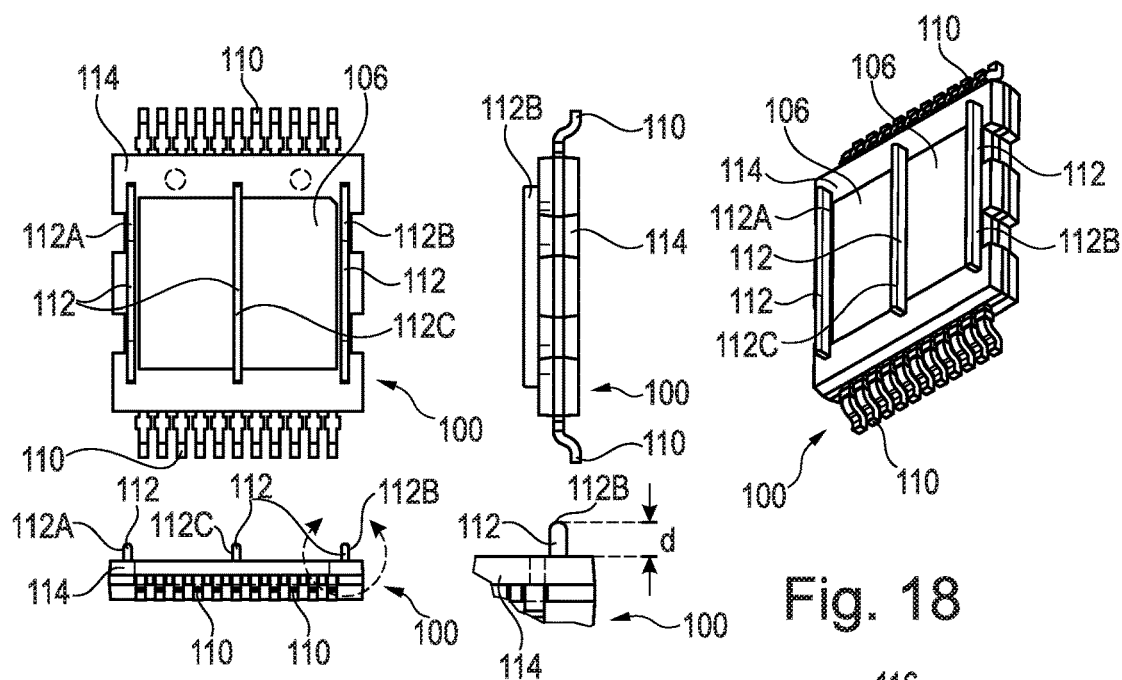
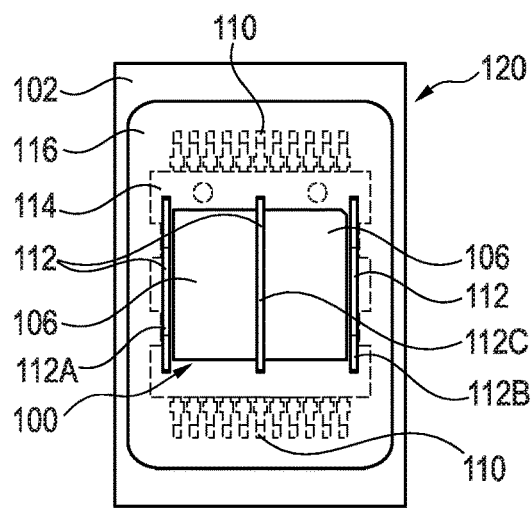
Fig. 19
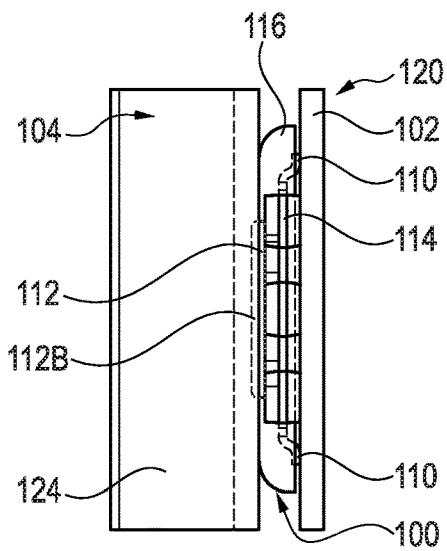
Fig. 20
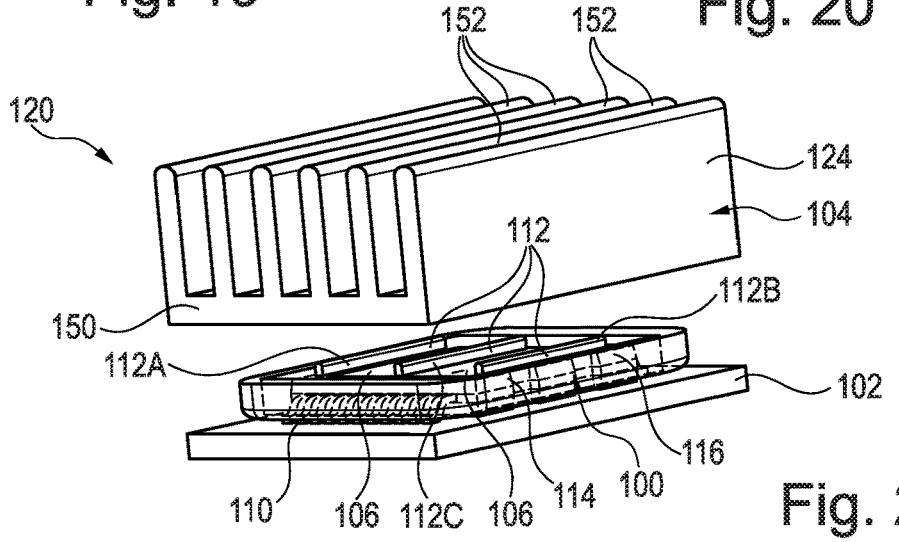
Fig. 21

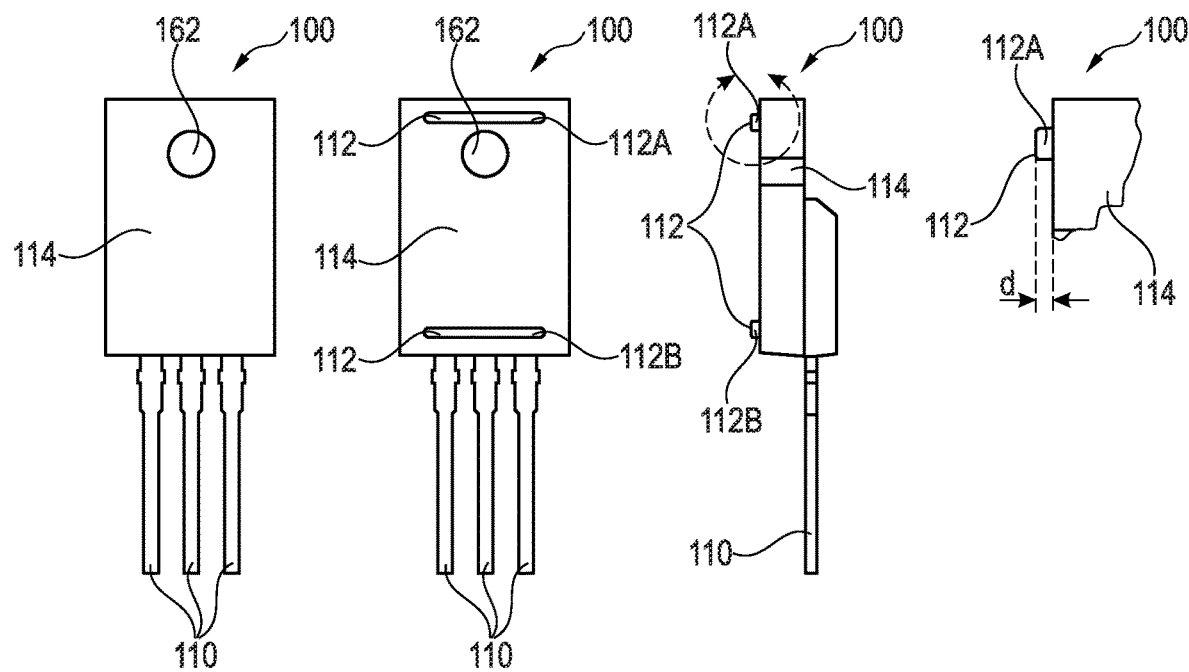
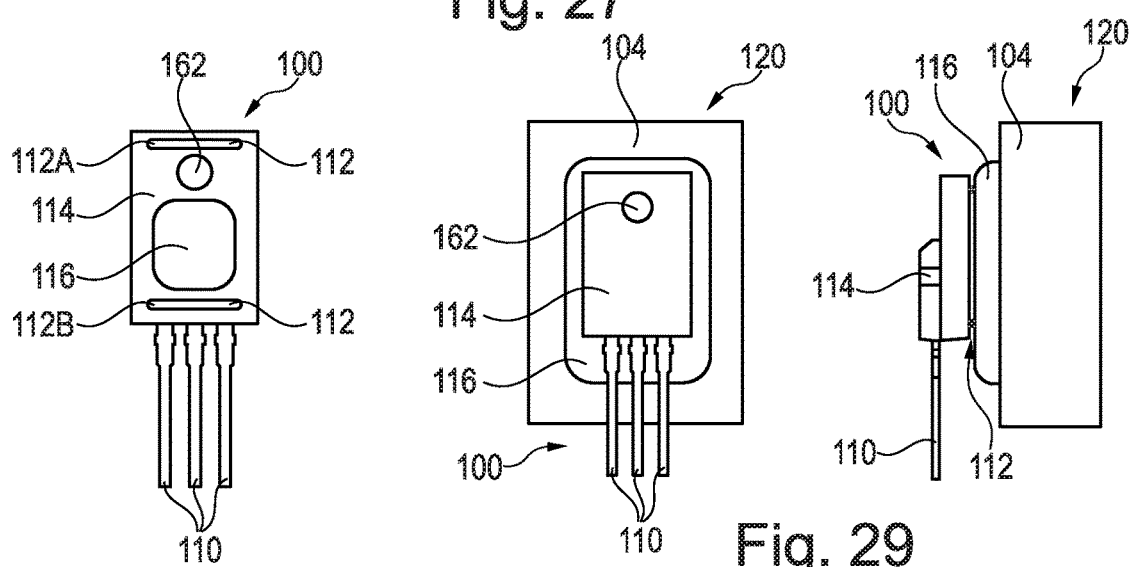
Fig. 27
Fig. 28
Fig. 29
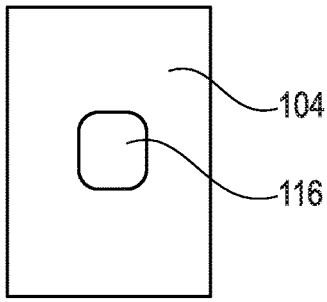
Fig. 30
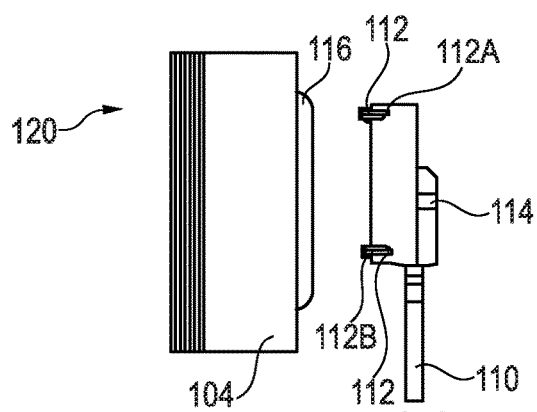
Fig. 31

LINEAR SPACER FOR SPACING A CARRIER OF A PACKAGE

CROSS-REFERENCE TO RELATED APPLICATION

This Utility Patent Application claims priority to German Patent Application No. 10 2020 129 423.9, filed Nov. 9, 2020, which is incorporated herein by reference.

BACKGROUND

Technical Field

Various embodiments relate generally to a package, an electronic device, a heat sink, and a method of manufacturing a package.

Description of the Related Art

Packages may be denoted as usually encapsulated electronic components with electrical connects extending out of the encapsulant. For example, packages may be connected to an electronic periphery, for instance mounted on a printed circuit board and/or connected with a heat sink, and may be connected via connectors to a larger system.

Packaging cost is an important driver for the industry. Related with this are performance, dimensions and reliability. The different packaging solutions are manifold and have to address the needs of a specific application.

In particular packages with power semiconductor chips may generate a considerable amount of heat during operation. This may limit reliability and performance. Efficiently removing heat from the package by a heat sink or the like may involve the risk of a deterioration of the dielectric isolation property of the package with respect to the environment.

BRIEF DESCRIPTION OF THE DRAWINGS

The accompanying drawings, which are included to provide a further understanding of exemplary embodiments and constitute a part of the specification, illustrate exemplary embodiments.

In the drawings:

FIG. 1 illustrates a schematic cross-sectional view of an electronic device comprising a package according to an exemplary embodiment and being mounted between a mounting base and a heat sink.

FIG. 2 illustrates different linear straight spacer bodies for packages according to exemplary embodiments.

FIG. 3 illustrates different linear curved spacer bodies for packages according to exemplary embodiments.

FIG. 4 illustrates a linear annularly closed spacer body for a package according to exemplary embodiments.

FIG. 5 illustrates different views of a package according to an exemplary embodiment.

FIG. 6 illustrates a plan view of an electronic device comprising a package according to FIG. 5.

FIG. 7 illustrates a side view of the electronic device according to FIG. 6.

FIG. 8 illustrates a three-dimensional exploded view of the electronic device according to FIG. 6.

FIG. 18 illustrates different views of a package according to still another exemplary embodiment.

FIG. 19 illustrates a plan view of an electronic device comprising a package according to FIG. 18.

FIG. 20 illustrates a side view of the electronic device according to FIG. 19.

FIG. 21 illustrates a three-dimensional exploded view of the electronic device according to FIG. 19.

FIG. 22 illustrates an electronic device with a package according to another exemplary embodiment.

FIG. 23 illustrates an electronic device with a package according to still another exemplary embodiment.

FIG. 27 to FIG. 29 illustrate different views of a package and a corresponding electronic device according to another exemplary embodiment.

FIG. 30 illustrates a heat sink for an electronic device according to an exemplary embodiment for connection with a package.

FIG. 31 illustrates a package according to another exemplary embodiment for connection with a heat sink.

DETAILED DESCRIPTION

Figure 9:
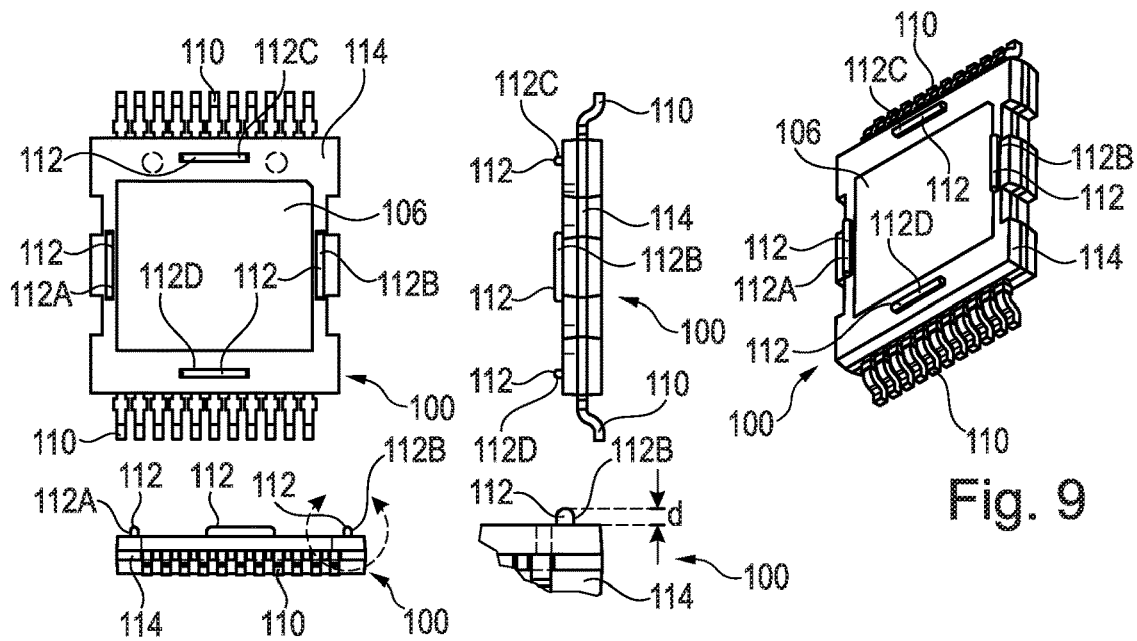
FIG. 9 illustrates different views of a package according to another exemplary embodiment.

The present application provides a package with proper electric reliability and efficient heat removal.

According to an exemplary embodiment, a package for mounting on a mounting base is provided, wherein the package comprises a carrier, an electronic component mounted at the carrier, leads electrically coupled with the electronic component and to be electrically coupled with the mounting base, and a linear spacer for defining a spacing with respect to the carrier.

According to another exemplary embodiment, an electronic device is provided, wherein the electronic device comprises a package for mounting on a mounting base and for being thermally coupled with a heat sink, wherein the package comprises a carrier to be thermally coupled with the heat sink, an electronic component mounted on the carrier, leads electrically coupled with the electronic component and to be electrically coupled with the mounting base, wherein the electronic device further comprises the heat sink mounted on the package so as to be thermally coupled with the carrier, and a linear spacer defining a spacing between the carrier and the heat sink.

According to still another exemplary embodiment, a heat sink for being thermally coupled with a carrier of a package is provided, wherein the heat sink comprises a thermally conductive body to be thermally coupled with the carrier for removing heat generated during operation of the package, and a linear spacer for defining a spacing between the carrier and the heat sink when mounted on the package.

According to yet another exemplary embodiment, a method of manufacturing a package for mounting on a mounting base is provided, wherein the method comprises mounting an electronic component at a carrier, electrically coupling leads, to be electrically coupled with the mounting base, with the electronic component, and providing a linear spacer for defining a spacing with respect to the carrier.

According to an exemplary embodiment, a linear spacer is provided for spacing a carrier of a package in a precisely defined manner with respect to an environment, which may be but is not limited to a heat sink. Hence, exemplary embodiments may relate to a package with an electronic component on a carrier (wherein the latter may or may not be exposed towards an environment). While efficient removal of heat created by the electronic component during operation of the package may be advantageously promoted via the carrier, the latter should be reliably spaced with regard to its environment to ensure high electric reliability. More specifically, the carrier should be electrically insulated from an environment, such as a heat sink, to avoid highly undesired electric short-circuiting, the formation of undesired electrically conductive paths, and loss of electric power and signal intensity as well as signal quality, etc. In order to accomplish this, exemplary embodiments provide a linear spacer ensuring a minimum spacing between the carrier and its environment. A linear spacer may be of utmost advantage, since it spaces the carrier not or not only via dot-shaped pins, but in contrast to this along an oblong trajectory defined by an oblong construction of the linear spacer. This may increase the robustness of the spacing function and consequently the reliability of the entire package. Descriptively speaking, the linear spacer may ensure a sufficiently large distance with respect to the carrier for achieving a proper electric isolation and at the same time a sufficiently small distance for obtaining a proper cooling performance. Advantageously, one or more raised or elevated linear spacer bodies may also function as a flow barrier disabling a flow of an optional but advantageous gap filler into undesired regions of the package, for instance for preventing coverage of package portions by the gap filler which shall remain exposed (for instance free ends of leads). Descriptively speaking, the linear spacer may also improve the distribution of a contact pressure applied for connecting a package with a heat sink. Furthermore, one or more raised or elevated linear spacer bodies may avoid an undesired tilting of the package, for instance when being assembled with a heat sink.

In a preferred embodiment, the linear spacer forms part of the package itself which makes it possible that the spacer is for example integrally formed with an encapsulant encapsulating the electronic component and the carrier. Such embodiments may be preferred, because they may enable to protect the carrier by the spacer function using features of the package itself, i.e. independent of an electronic environment of the package. It may however also be possible to form a linear spacer as part of another body for connection with the package, such as a heat sink or an intermediate body to be sandwiched between the heat sink and the package.

In the following, further exemplary embodiments of the package, the electronic device, the heat sink, and the method will be explained.

In the context of the present application, the term "package" may particularly denote an electronic member which may comprise one or more electronic components mounted on a carrier, said carrier to comprise or consist out of a single part, multiple parts joined via encapsulation or other package components, or a subassembly of carriers. Said constituents of the package may be optionally encapsulated at least partially by an encapsulant.

In the context of the present application, the term "mounting base" may in particular denote a support body on which the package may be assembled, for instance together with one or more further packages. In particular, such a support body may be mechanically and electrically coupled with the package(s). In particular, the mounting base may be a plate-shaped electronic mounting base, such as a printed circuit board (PCB).

In the context of the present application, the term "carrier" may particularly denote a support structure which serves as a mechanical support for the one or more electronic components to be mounted thereon. In other words, the carrier may fulfil a mechanical support function. Additionally alternatively, a carrier may also fulfill an electrical connection function. A carrier may comprise or consist of a single part, multiple parts joined via encapsulation or other package components, or a subassembly of carriers.

In the context of the present application, the term "electronic component" may in particular encompass a semiconductor chip (in particular a power semiconductor chip), an active electronic device (such as a transistor), a passive electronic device (such as a capacitance or an inductance or an ohmic resistance), a sensor (such as a microphone, a light sensor or a gas sensor), an actuator (for instance a loudspeaker), and a microelectromechanical system (MEMS). In particular, the electronic component may be a semiconductor chip having at least one integrated circuit element (such as a diode or a transistor) in a surface portion thereof. The electronic component may be a naked die or may be already packaged or encapsulated. Semiconductor chips implemented according to exemplary embodiments may be formed in silicon technology, gallium nitride technology, silicon carbide technology, etc.

In the context of the present application, the term "lead" may in particular denote an electrically conductive (for instance strip shaped) element (which may be planar or bent) which may serve for contacting the electronic component with respect to an exterior of the package. For instance, a lead may be partially encapsulated and partially exposed with respect to an encapsulant.

In the context of the present application, the term "linear spacer" may in particular denote a spacer which may be embodied as a single spacer body or a plurality of separate spacer bodies and providing a spacing function for a package carrier along an elongated spacer line rather than only by one or more spacer dots or points or pins. For instance, a length of a linear spacer may be at least three times of, in particular at least five times of, preferably at least eight times of a width of the spacer. In particular, the linear spacer may comprise one or more straight spacer bodies extending straight along a particular direction. Additionally or alternatively, the linear spacer may comprise one or more curved spacer bodies. For instance, a curved spacer body may be continuously curved (such as a circular shape, a semicircular shape, an oval shape or an S-shape). Additionally or alternatively, the spacer body may be discontinuously curved, like a zigzag shape, a sawtooth shape, or a meander shape. In one embodiment, a spacer body of the linear spacer may extend between a first free end and a second free end. However, a spacer body may also be embodied as an annularly closed spacer body. Two or more separate linear spacer bodies, or only a single spacer body are possible.

Different spacer bodies of the linear spacer may have the same shape and/or dimensions or may have different shapes and/or dimensions. Optionally, one or spacer pins may be provided in addition to the linear spacer.

In the context of the present application, the term "heat sink" may in particular denote a highly thermally conductive body which may be thermally coupled with the package and in particular the carrier of the package for removing heat generated by the electronic component during operation of the package. For example, the heat sink may be made of a material having a thermal conductivity of at least 10 W/mK, in particular at least 50 W/mK. For instance, the heat sink may be made of copper and/or aluminum and/or a ceramic material. The heat sink may be indirectly thermally coupled with the carrier, for instance by a thermally conductive and electrically insulating gap filler. For example, the heat sink may comprise a thermally conductive body (such as a metal plate) with a plurality of cooling fins extending from the thermally conductive body.

In an embodiment, the spacer is configured for defining a spacing between the carrier and a heat sink to be thermally coupled with the carrier when the heat sink is mounted on the package. Thus, the linear spacer may guarantee a reliable electric isolation between the exposed carrier surface and the heat sink and may simultaneously ensure a proper thermal coupling between the exposed carrier surface and the heat sink.

In an embodiment, the package comprises an encapsulant encapsulating at least part of the electronic component, at least part of the carrier, and part of the leads, so that another part of the leads is exposed with respect to the encapsulant to be electrically couplable with the mounting base. In the context of the present application, the term "encapsulant" may particularly denote a substantially electrically insulating and preferably thermally conductive material surrounding at least part of an electronic component and at least part of a carrier, as well as a part of the leads. For instance, the encapsulant may be a mold compound and may be created for example by transfer molding.

In one alternative, a part of the carrier may be exposed with respect to the encapsulant. This may guarantee an excellent heat removal performance, while electric isolation may be ensured by the linear spacer.

In another alternative, the entire carrier may be encapsulated by the encapsulant. Hence, a double protection in terms of electric isolation may thus be provided by material of the encapsulant covering an exterior surface of the carrier in addition to the linear spacer functionality. According to such an embodiment, the package does not have any exposed pad at the package body, which contains the spacer(s) at the package surface. Hence, the package may be fully covered by encapsulation material except out-leads on one side of the package, wherein the spacer may be placed at the package surface. In particular, a thermally conductive mold compound can be arranged between the heat sink or a gap filler on the one hand and the chip carrier on the other hand. With such a configuration, even very strict specifications in terms of double isolation may be complied with.

In a preferred embodiment, the spacer forms part of the encapsulant. Correspondingly, the method may comprise forming the spacer as part of the encapsulant, in particular by molding. Preferably, at least one mold insert may be used for defining the linear spacer to be integrally formed with the encapsulant. With such embodiments, manufacture of the spacer may be carried out simultaneously with the formation of the encapsulant (in particular by molding) and thus without adding extra effort to the manufacture. At the same time, embodying the linear spacer as a mold structure results automatically in a dielectric property of the linear spacer. Furthermore, forming encapsulant and linear spacer as an integral encapsulation structure may eliminate any adhesion issues between encapsulant and linear spacer.

However, in an alternative embodiment, the linear spacer of the package may be provided as a separate element with respect to the encapsulant.

In an embodiment, the linear spacer has an extension which extends beyond an extension of the exposed part of the carrier. By such a preferred embodiment with one or more linear spacer bodies having a length larger than a corresponding length or width of the carrier, a particularly reliable dielectric isolation between the carrier and an electronic environment of the package may be guaranteed.

In an embodiment, the spacer has a vertical extension of at least 30 μm, in particular has a vertical extension in a range from 100 μm to 1000 μm. The concept of a linear spacer in particular within the mentioned thickness ranges may allow to adjust the distance between the carrier and another body (such as the heat sink) in accordance with a desired isolation voltage, which may be defined by a specification.

In an embodiment, the carrier and the leads form part of a patterned metal plate. For instance, they may both form part of a common leadframe. The carrier may then be a die pad of the leadframe. Such an embodiment allows a particular simple manufacture of the package.

In an embodiment, the spacer forms a top end of the package. In other words, the linear spacer may protrude beyond the rest of the package, in particular beyond an exposed surface of the carrier and beyond a rest of an encapsulant.

In an embodiment, the spacer comprises at least one spacer bar. For instance, such a bar may be a linear straight or curved oblong spacer body extending in a length direction between two opposing ends. For instance, the width and/or the height of the bar may be constant along its entire extension.

In an embodiment, the spacer comprises two or more spacer bars. Different spacer bars may have the same height or may have different heights. For instance, a central spacer bar may have a lower height than two exterior spacer bars. By adjusting length and/or height and/or position of different spacer bars of the same package and in particular on the same main surface of package, the spacer functions may be fine-tuned.

For example, said spacer bars may extend along two opposing sides of the package. Such exterior spacer bars may then also function as flow barrier for preventing a flow of gap filler material into undesired regions.

In one embodiment, each of the two spacer bars extends along essentially an entire side of the package. Said two spacer bars may enclose an exposed surface of the carrier at a main surface of the package laterally at two sides. Such a configuration provides a flow restriction barrier for flowable or viscous precursor material of a gap filler described below in further detail.

In another embodiment, the spacer comprises four spacer bars extending along each of all four sides of the package. Said four spacer bars may circumferentially surround an exposed surface of the carrier at a main surface of the package. Both configurations may promote a proper electric isolation function, may mechanically protect an exposed carrier surface, and may also protect the package against undesired tilting.

In an embodiment, each of the four spacer bars extends along not more than half of a respective side of the package. This saves material and keeps the package compact without compromising the spacer functions.

In an embodiment, at least one of the at least one spacer bar extends through a central region of the package. This provides the package with additional stability and an additional electric isolation contribution.

In an embodiment, the spacer is made of an electrically insulating material, in particular a mold compound. Such a mold compound constituting an encapsulant of the package may advantageously comprise thermally conductive filler particles (for instance made of a ceramic material such as aluminum nitride, aluminum oxide, silicon oxide, silicon nitride, etc.) for enhancing thermal conductivity of the mold compound. When also the spacer is made of a mold compound, preferably integral with the encapsulant, also the spacer mold compound may comprise said filler particles which increases the thermal conductivity of the spacer body while simultaneously ensuring proper dielectric properties of the spacer body. In other words, the material of the spacer body may be electrically insulating and thermally conductive (in particular having a thermal conductivity of at least 1 W/mK, in particular of at least 2 W/mK, preferably at least 5 W/mK, for instance even 10 W/mK).

In an embodiment, an exterior surface of the carrier to be thermally coupled with the heat sink on the one hand, and contact areas of the leads to be electrically coupled with the mounting base on the other hand, are arranged on two opposing sides of the package. In particular, an end portion of at least part of the leads may be bent away from the carrier. Bending the leads towards the mounting base side of the package and away from heat sink side of the package may additionally increase the spatial separation between the electric connection side of the package (facing the mounting base) and the cooling side of the package (facing the heat sink).

In an embodiment, the package comprises an electrically insulating and thermally conductive gap filler on an exterior side of the carrier. Correspondingly, the method may comprise forming an electrically insulating and thermally conductive gap filler on an exterior side of the package, and in particular on part of the leads. More specifically, the gap filler may for example be formed on an exposed surface of the carrier. Additionally or alternatively, the gap filler may be formed on an exterior side of an encapsulant encapsulating at least part of the electronic component, at least part of the carrier (i.e. only a sub-portion of the carrier or the entire carrier) and part of the leads. Such a gap filler may be supplied in an uncured state in flowable form onto the main surface of the package at which the carrier is exposed. Such a gap filler may strengthen the dielectric isolation on the heat sink side of the package while simultaneously improving the thermal coupling between package and heat sink.

In an embodiment, the gap filler covers part of the leads. This may electrically decouple and mechanically protect central lead portions extending beyond an encapsulant and being not used for an electric connection.

In an embodiment, the gap filler comprises thermally conductive filler particles, in particular ceramic filler particles. Adding fillers to a flowable or viscous matrix material of the gap filler may allow to improve the heat removal contribution of the gap filler.

In an embodiment, the method comprises forming the gap filler by applying a flowable or viscous precursor and subsequently hardening the precursor, in particular by heating and/or by a chemical reaction between different constituents of the precursor. This may allow to provide the gap filler in flowable or viscous form for distributing it substantially over an entire gap volume between package and heat sink, with a small connection pressure being sufficient. By a subsequent curing process, the gap filler may be solidified so as to permanently cover part of the package surface.

In an embodiment, the method comprises dispensing a flowable or viscous precursor of the gap filler on the carrier and distributing the flowable or viscous precursor by pressing the heat sink onto the spacer. Additionally or alternatively, the precursor of the gap filler may be applied to the heat sink before connecting it with the carrier.

In an embodiment, at least part of the carrier is electrically conductive. Thus, the carrier may fulfil an electric coupling function in addition to its mechanical support function for supporting or carrying the electronic component(s).

In an embodiment, the package comprises a plurality of electronic components mounted on the carrier. Thus, the package may comprise one or more electronic components (for instance at least one passive component, such as a capacitor, and at least one active component, such as a semiconductor chip).

In an embodiment, the package comprises at least two electronic components being laterally spaced by at least part of the spacer. In particular, a multi-chip package may be provided with a central linear spacer body spatially separating adjacent semiconductor chips. Hence, such a chip-spacing linear spacer body may increase the creepage distance between the adjacent chips and may further improve the electric reliability.

In an embodiment, the spacer forms part of at least one of the package, the heat sink, and an intermediate body arranged between the package and the heat sink. It may be preferred that the spacer forms part of the package since this allows the manufacture of the linear spacer as a portion of an encapsulant and thus without separate manufacturing effort. Moreover, the linear spacer will then automatically be electrically insulating, which is advantageous for its electric decoupling function. It is however additionally or alternatively also possible to form a linear spacer on a surface of a heat sink facing the package in an assembled state. Furthermore, a separate intermediate body (such as a frame or a grid) between package and heat sink may be provided so as to function as linear spacer.

In an embodiment, the electronic device comprises a mounting base on which the package is mounted and being electrically coupled with the leads. Such a mounting base may be an electronic board serving as mechanical base for the package and being electrically couplable with the leads of the package.

In an embodiment, the carrier comprises a stack composed of a central electrically insulating and thermally conductive layer (such as a ceramic layer) covered on both opposing main surfaces by a respective electrically conductive layer (such as a copper layer or an aluminium layer, wherein the respective electrically conductive layer may be a continuous or a patterned layer). In particular, the carrier may be a Direct Copper Bonding (DCB) substrate or a Direct Aluminium Bonding (DAB) substrate. However, the carrier may also be configured as Active Metal Brazing (AMB) substrate, or as patterned metal plate (for example a leadframe).

In an embodiment, the at least one electronic component comprises at least one of the group consisting of a controller circuit, a driver circuit, and a power semiconductor circuit. All these circuits may be integrated into one semiconductor chip, or separately in different chips. For instance, a corresponding power semiconductor application may be realized by the chip(s), wherein integrated circuit elements of such a power semiconductor chip may comprise at least one transistor (in particular a MOSFET, metal oxide semiconductor field effect transistor), at least one diode, etc. In particular, circuits fulfilling a half-bridge function, a full-bridge function, etc., may be manufactured.

In an embodiment, the package is configured as power converter, in particular one of an AC/DC power converter and a DC/DC power converter. However, also other electronic applications, such as inverters, etc., may be possible.

As substrate or wafer for the semiconductor chips, a semiconductor substrate, i.e. a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

Furthermore, exemplary embodiments may make use of standard semiconductor processing technologies such as appropriate etching technologies (including isotropic and anisotropic etching technologies, particularly plasma etching, dry etching, wet etching), patterning technologies (which may involve lithographic masks), deposition technologies (such as chemical vapor deposition (CVD), plasma enhanced chemical vapor deposition (PECVD), atomic layer deposition (ALD), sputtering, etc.).

The above and other objects, features and advantages will become apparent from the following description and the appended claims, taken in conjunction with the accompanying drawings, in which like parts or elements are denoted by like reference numbers.

The illustration in the drawing is schematically and not to scale.

Before exemplary embodiments will be described in more detail referring to the figures, some general considerations will be summarized based on which exemplary embodiments have been developed.

Generally, surface mounted device (SMD) packages are characterized by an increasing power density of application boards. Consequently, thermal dissipation becomes more and more critical to achieve a high power efficiency. A fully automated assembly may reduce the manufacturing effort and may increase the quality. In particular, SMD package technology follows the shrinking trend and leads to a thermal dissipation challenge. More specifically, SMD package technology is moving from voltage classes below 650 V to voltage classes of up to 1200 V or even 1700 V, and above.

Such SMD packages may be mounted on a mounting base or application board such as a printed circuit board (PCB). Such an application board may comprise several discrete packages, in particular from the same package type or package family. This may be done to achieve a complete power conversion topology. However, height tolerances of the package and SMT process may lead to different levels. These tolerances may have to be compensated by thermally conductive isolation liquids. However, these liquids are not able to guarantee the isolation thickness, therefore the isolation may not be defined in a proper way. For high voltage classes of for example 650 V and above, this may become very critical.

According to an exemplary embodiment, a spatially elongated linear spacer is provided preferably at an exterior surface of a package with exposed carrier for ensuring a predefined minimum spacing between the carrier and a thermal and/or an electronic environment, for instance a heat sink being thermally coupled with the package. Such a linear rather than merely dot-shaped spacer may ensure an electric decoupling between the carrier and the environment (like a heat sink) and may thus guarantee a high electric reliability of the package. Advantageously, a heat sink (for instance made of a metal such as copper or aluminum) may be pressed on the package until direct physical contact between the elongate linear spacer and the heat sink is achieved while the linear spacer ensures an exposed carrier surface spaced with respect to the heat sink. This ensures both a proper thermal coupling between package and heat sink and a reliable dielectric decoupling between package and heat sink.

Advantageously, a flowable or viscous gap filler (for instance a medium in a liquid or paste-like condition before curing) with electrically insulating and preferably thermally conductive properties may be inserted into a gap between the package (which its spacer(s)) and the heat sink. Advantageously, the package design and the way of supplying gap filler to the package may be set in a manner that the gap filler covers the exposed carrier and flows over part of the exposed leads. This may further promote a proper electric isolation while additionally improving the thermal properties. Particularly preferably, one or more web-shaped linear spacer bodies may be arranged as a flow guide and/or flow barrier for the gap filler to guide an intentional flow and/or disabling an unintentional lateral flow of the gap filler beyond the spacer-defined flow barrier. Such a gap filler may be hardened or cured by supplying thermal heat (for instance by raising the temperature to an elevated level of for example 120° C. or more) and/or by providing the gap filler as a mixture of two or more components configured for hardening upon mixing (in particular even at room temperature). For instance, curing may result in a cross-linking of gap filler material. The gap filler may be dispensed on an exposed surface of the package (in particular on an exposed surface of the carrier) and may be spatially distributed by mechanical pressure. Such a gap filler may ensure a proper thermal coupling between carrier and heat sink, since it will flow equally over a spacing volume between package and heat sink as defined by the linear spacer. Preferably, such a gap filler may also embed part of the exposed portions of the leads. Highly advantageously, the linear spacer may be positioned, shaped and dimensioned for forcing a guided flow of the gap filler only into desired regions of the package surface.

As compared to conventional package designs, exemplary embodiments may make it possible to mount the package (with its linear spacer) with low pressing force or even in a substantially force-free way on a heat sink, preferably with a flowable or viscous gap filler in between.

While it is also possible that the linear spacer forms part of the heat sink or even of a separate intermediate body (such as a frame or a grid to be sandwiched between spacer and heat sink) rather than of the package, providing the linear spacer as part of the package itself may be preferred. The reason is that it is then possible to provide the spacer function by the package itself and preferably with a dielectric linear spacer forming most preferably part of a dielectric mold compound of the package. Integrally forming the linear spacer as part of an encapsulant of the package may allow the manufacture of a linear spacer essentially without any additional effort, automatically with dielectric properties, and without adhesion issues of the spacer at the package.

Exemplary applications of exemplary embodiments are packages in the technical fields of electromobility, charging, server applications, and power supply (in particular mains adapters). Moreover, exemplary embodiments may be applied particularly advantageously in SMD type power semiconductor packages for a high voltage application with top side cooling via an exposed chip carrier.

According to an exemplary embodiment, an SMD package with top side cooling and with an adjustable linear distance spacer may be provided. More specifically, such an SMD top side cooling package may be provided with a linear spacer function for achieving an improved electric isolation as well as electric and thermal reliability. More specifically, the linear spacer may be configured for providing a defined isolation thickness when implemented together with an application board. Advantageously, a linear spacer (which may be embodied as one or more spacer bars) may define a mold-flow orientation in lead direction when referring to package leads on an application board or mounting base such as a PCB. Preferably, the linear spacer architecture according to an exemplary embodiment may make use of adjustable spacer lengths by the usage of molding structures. In particular, the one or more spacer bars may be located on the side of the package. Advantageously, one or more spacer bars with adjustable length(s) may be manufactured in a simple and precise way by the usage of a corresponding molding insert.

FIG. 1 illustrates a schematic cross-sectional view of an electronic device 120 comprising a package 100 according to an exemplary embodiment and being mounted between a mounting base 102 at a bottom side and a heat sink 104 on a top side.

The electronic device 120 is manufactured in SMD technology and is composed of the semiconductor chip package 100, heat sink 104 on top thereof and mounting base 102 at the bottom side of the electronic device 120 and below the package 100.

For example, heat sink 104 may be a thermally conductive body 124 made of a highly thermally conductive material such as copper or aluminum. For example, the heat sink 104 may comprise a metallic plate 150 facing the package 100 and a plurality of mutually spaced cooling fins 152 integrally formed with the metallic plate 150 and facing away from the package 100. As shown, the heat sink 104 may be mounted on or attached to the package 100 so as to be thermally coupled with an exposed carrier 106 of the package 100. However, the heat sink 104 securely remains spaced with respect to the carrier 106 by a linear spacer 112 of the package 100. The linear spacer 112 is here composed of two separate linear spacer bodies 112A, 112B, as described in further detail below.

As already mentioned, the electronic device 120 comprises mounting base 102, which is here embodied as a printed circuit board (PCB). The package 100 is mounted, for instance by soldering, on the mounting base 102 so that electrically conductive pads 154 of the mounting base 102 are electrically coupled with free ends of electrically conductive leads 110 extending beyond a mold-type encapsulant 114 of the package 100. Solder structures between the pads 154 and the leads 110 are shown in FIG. 1 with reference signs 156.

The electrically conductive leads 110 (for instance made of copper or aluminum) of the package 100 are electrically coupled with pads 160 of an electronic component 108 of the package 100 by electrically conductive connection elements 158. In the shown embodiment, the electrically conductive connection elements 158 are bond wires, but may be alternatively bond ribbons or clips in other embodiments. As shown, the end portions of the leads 110 soldered on the pads 154 of the mounting base 102 may be bent away from the carrier 106. By taking this measure, the electric coupling side on the lower main surface of the package 100 is spatially separated from the cooling side on the upper main surface of the package 100.

It is possible that the carrier 106 and the leads 110 form part of a common patterned metal plate, for instance in a leadframe configuration. As shown, an exterior surface of the carrier 106 being thermally coupled with the heat sink 104 is located at an upper side of the package 100 according to FIG. 1. In particular, carrier 106 may be partially or entirely electrically conductive. Contact areas of the leads 110 being electrically coupled with the mounting base 102 are arranged on a lower side of the package 100.

The package 100 comprises the already mentioned carrier 106 which carries on its lower main surface the electronic component 108 and is thermally coupled at its upper main surface with the heat sink 104 via a thermally conductive gap filler 116 in a gap between a bottom side of the heat sink 104 and an exposed upper main surface of the carrier 106. For instance, the carrier 106 may be a Direct Copper Bonding (DCB) substrate, a Direct Aluminum Bonding (DAB) substrate, an Active Metal Brazing (AMB) substrate or a patterned metal plate such as a leadframe.

Electronic component 108 is mounted on one main surface (which may be denoted as a mounting surface) of the carrier 106, which is a lower main surface as according to FIG. 1. Said mounting surface may oppose another main surface of the carrier 106, which is oriented towards the heat sink 104. For instance, the electronic component 108 may be a semiconductor chip, for example a power semiconductor chip. Said semiconductor chip may comprises at least one integrated circuit element in a semiconductor body. Such at least one integrated circuit element may for example provide the function of a transistor (for instance of a MOSFET or an IGBT), a diode, etc.

As shown, the package 100 may further comprise encapsulant 114 encapsulating the electronic component 108, part of the leads 110, and part of the carrier 106. However, another part of the leads 110 is exposed with respect to the encapsulant 114 to be electrically couplable with the mounting base 102, as shown and described above. Furthermore, another part of the carrier 106 is exposed with respect to the encapsulant 114 so as to be thermally coupled with the heat sink 104. Preferably, encapsulant 114 is electrically insulating. For example, the encapsulant 114 may be a mold compound (or alternatively a soft encapsulant).

As already mentioned, package 100 comprises linear spacer 112 which is here embodied as two separate and elongate linear spacer bodies 112A, 112B. As shown, the spacer 112 forms a top end of the package 100. Advantageously, linear spacer 112 serves for defining a spacing between the carrier 106 and the heat sink 104 mounted on the package 100. More specifically, a vertical extension, d, of the spacer bodies 112A, 112B defines a gap with the same vertical extension, d, between the exposed upper main surface of the carrier 106 and the lower main surface of the heat sink 104.

Highly advantageously, the linear spacer 112 may form an integral part of the encapsulant 114, i.e. may be made of the same dielectric mold compound material and may be manufactured directly during the molding process for encapsulating electronic component 108, carrier 106, leads 110, etc. Thus, it may be possible to create the linear spacer 112 as part of the encapsulant 114 by molding using mold inserts for precisely defining the spacer geometry. Consequently, no extra effort for manufacturing the linear spacer 112 is involved. Moreover, the dielectric property of the linear spacer 112 contributes to an improvement of the electrical reliability, since it guarantees a spacing of the exposed surface of the carrier 106 with respect to the heat sink 104 by the precisely defined distance "d".

At the same time, manufacturing the electronic device 120 by pressing the heat sink 104 onto the package 100 with flowable gap filler 116 in between will also ensure that the distance between the exposed surface of the carrier 106 and heat sink 104 is limited to the value "d". Thus, it may be possible to dispense a flowable or viscous precursor of the gap filler 116 on the carrier 106 and distribute the flowable precursor by pressing the heat sink 104 onto the spacer 112. This may ensure simultaneously an excellent thermal coupling between package 100 and heat sink 104. Consequently, the heat removal capability of the electronic device 120 and consequently the performance of the package 100 may be excellent. During the connection of package 100 and heat sink 104, direct physical contact between package 100 and heat sink 104 exists exclusively between the flange face of the linear spacer 112 and the thermal coupling surface of the heat sink 104, i.e. the lower main surface of the metallic plate 150 in the illustrated example. As a result, the flowable gap filler 116 will distribute equally over the volume of the gap between package 100 and heat sink 104 defined by the linear spacer 112. The material of gap filler 116 may then be cured, for instance thermally by supplying heat and/or by mixing two or more gap filler constituents triggering a chemical curing. Consequently, gap filler 116 may be solidified by curing. Hence, it may be possible to form a solid cured gap filler 116 by applying a flowable or viscous precursor and subsequently hardening the precursor by heating and/or by a chemical reaction between different constituents of the precursor. Advantageously, gap filler 116 being located on an exterior side of the carrier 106 facing the heat sink 104 may comprise thermally conductive filler particles, such as ceramic filler particles like aluminum nitride. This may further increase the thermal conductivity of the gap filler 116 and consequently the thermal performance of the electronic device 100 with its package 100.

As shown in FIG. 1, the linear spacer 112 has the vertical extension "d" which can be adjusted over a broad range of for instance 100 μm to 1000 μm. A value from this range may ensure both a proper performance and a safe isolation. The exact value may be selected in accordance with the requirements of a specific package design, in particular a required or desired electric isolation and/or heat removal capability. With the described embodiment, it may thus be possible to provide a linear distance spacer 112 which ensures a guaranteed isolation thickness "d". Preferably, the distance spacer 112 is based on molding material, therefore its height is easily adjustable. For example, it may be possible to adjust the spacer height and thus the isolation thickness "d" to 0.2 mm, 0.3 mm, 0.4 mm or 0.5 mm for different voltage classes. For creating gap filler 116 which further promotes the thermal coupling, it may be possible to dispense thermally conductive liquid(s) on the package 100 or on the heat sink 104. Moreover, it may be possible to mount the application heat sink 104 onto the package 100. The heat sink 104 may be fixed on the mounting base 102 by using a fastening element such as a screw or clip (not shown). Advantageously, the linear distance spacer 112 may determine the isolation layer thickness "d". Preferably, a liquid precursor of the gap filler 116 is forced to flow to all four sides of the package 100. The gap filler 116 may be provided advantageously with defined thickness to thereby ensure a proper isolation and a proper thermal performance of the electronic device 120.

The linear spacer 112 with its linear spacer bodies 112A, 112B is only shown in a cross-sectional view in FIG. 1. Referring to FIG. 2 to FIG. 4, different possible geometries of linear spacer bodies 112A, 112B, 112C are illustrated which can be implemented in packages 100, heat sinks 104, separate intermediate bodies 122, etc.

FIG. 2 illustrates different linear straight spacer bodies 112A, 112B, 112C of packages 100 according to exemplary embodiments. As can be seen in FIG. 2, a linear space 112 may be composed of a plurality of separate linear spacer bodies 112A, 112B, 112C and each extending between a first free end and a second free end. Spacer body 112A is configured as oblong straight line with constant width. Spacer bodies 112B are configured as three linearly aligned straight strips with constant width. Spacer body 112C is configured as substantially I-shaped oblong straight line with laterally broadened ends.

FIG. 3 illustrates different linear curved spacer bodies 112A, 112B of packages 100 according to exemplary embodiments. Linear curved spacer body 112A is substantially C-shaped and may form a section of a circle. Linear curved spacer body 112B is substantially S-shaped and thus relates to a trajectory along which the sign of the curvature changes.

FIG. 4 illustrates a linear annularly closed spacer body of a package 100 according to an exemplary embodiment. In other words, FIG. 4 shows a ring-shaped spacer body with closed perimeter, i.e. without free end. The ring of FIG. 4 has a rectangular shape, but may also have any other polygonal shape or also a round shape (for instance a circular shape).

FIG. 5 illustrates different views of a package 100 according to an exemplary embodiment. FIG. 6 illustrates a plan view of an electronic device 120 comprising package 100 according to FIG. 5. FIG. 7 illustrates a side view of the electronic device 120 according to FIG. 6. FIG. 8 illustrates a three-dimensional exploded view of the electronic device 120 according to FIG. 6.

As best seen in FIG. 5, the linear spacer 112 of this embodiment comprises two straight spacer bodies 112A, 112B extending in parallel to each other along two opposing sides of the package 100. The bar-shaped spacer bodies 112A, 112B both extend along a periphery of an exposed surface of the carrier 106. In the shown embodiment, the linear spacer bodies 112A, 112B are embodied as spacer bars. The exposed surface of the carrier 106 is located between the spacer bars. Each of the two spacer bars extends along almost an entire side of the package 100. In particular, each of the spacer bodies 112A, 112B has an extension, i.e. a length, which extends beyond an extension of, i.e. has a larger length than, the exposed part of the carrier 106. As a consequence, an excellent electric isolation may be guaranteed by the illustrated linear spacer 112. The illustrated distance spacer bodies 112A, 112B on two opposing sides of the package 100 may reliably ensure a guaranteed isolation thickness "d". In the shown embodiment, the linear distance spacer 112 can be created as molding bars with easily adjustable height of for example 0.2 mm, 0.3 mm, 0.4 mm, or 0.5 mm. Different heights may be selected for example for different voltage classes.

Referring again to FIG. 5, one main surface of the package 100 is constituted by a planar area defined by material of the encapsulant 114 as well as by an exposed surface of the carrier 106. The linear spacer 112, which is here embodied as two linear spacer bodies 112A, 112B, protrudes beyond said planar area by the distance "d".

As shown in FIG. 6 to FIG. 8, electrically insulating and thermally conductive gap filler 116 is not only formed on an exterior side of the carrier 106 but additionally also on a part of the leads 110. This is accomplished in the presently described embodiment in such a way that a first end section of the leads 110 is encapsulated in encapsulant 114, an opposing second end section of the leads 110 is exposed, and a central portion of the leads 110 in between the first end section and the second end section is covered by the gap filler 116. In the embodiment of FIG. 5 to FIG. 8, it may be possible to dispense a thermally conductive liquid on the package 100 or on the heat sink 104 for creating the gap filler 116 with defined thickness. This may ensure a proper isolation and an advantageous thermal performance. Descriptively speaking, the illustrated arrangement of distance spacer bars or bodies 112A, 112B controls the mold-flow of said liquid so that liquid is flowing in a directed way into the direction of SMD leads 110.

As shown in FIG. 6 to FIG. 8 as well, the heat sink 104 may be mounted onto the package 100. It may be possible to fix the heat sink 104 on the mounting base 102 by using a screw or clip (not shown).

The embodiment of FIG. 5 to FIG. 8 has the advantages of a reduced material usage, a particularly reliable package lead isolation, and an excellent cooling performance.

Figure 10:
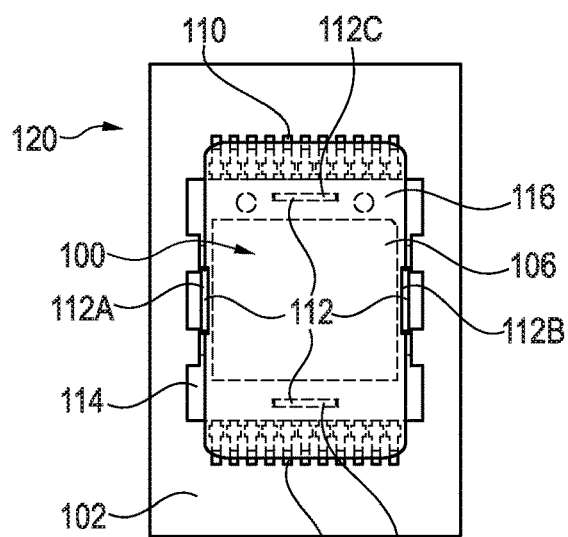
FIG. 10 illustrates a plan view of an electronic device comprising a package according to FIG. 9.
Figure 11:
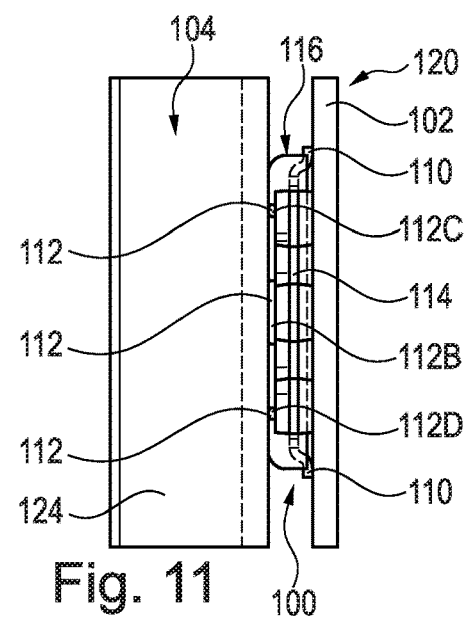
FIG. 11 illustrates a side view of the electronic device according to FIG. 10.
Figure 12:
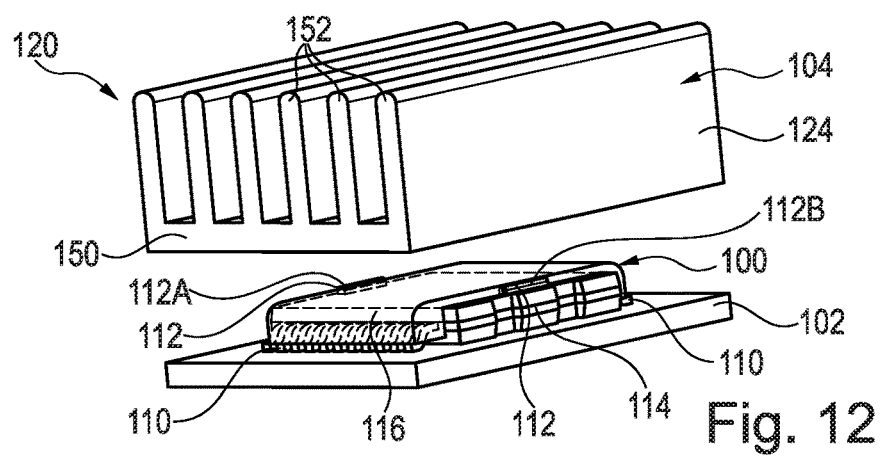
FIG. 12 illustrates a three-dimensional exploded view of the electronic device according to FIG. 10.

FIG. 9 illustrates different views of a package 100 according to an exemplary embodiment. FIG. 10 illustrates a plan view of an electronic device 120 comprising package 100 according to FIG. 9. FIG. 11 illustrates a side view of the electronic device 120 according to FIG. 10. FIG. 12 illustrates a three-dimensional exploded view of the electronic device 120 according to FIG. 10.

The embodiment of FIG. 9 to FIG. 12 differs from the embodiment of FIG. 5 to FIG. 8 in particular in that, according to the embodiment of FIG. 9 to FIG. 12, the linear spacer 112 comprises four spacer bars or bodies 112A, 112B, 112C, 112D extending along each of all four sides of the package 100. Spacer bars or bodies 112A, 112B extend parallel to each other. Correspondingly, spacer bars or bodies 112C, 112D extend parallel to each other. Furthermore, spacer bars or bodies 112A, 112B extend perpendicular to spacer bars or bodies 112C, 112D. Moreover, each of the four spacer bodies 112A, 112B, 112C, 112D extends along less than half of a respective side of the package 100.

The embodiment of FIG. 9 to FIG. 12 has the advantages of a highly homogeneous pressure distribution during providing gap filler 116 between package 100 and heat sink 104 when pressing them together. Furthermore, this embodiment may allow for a well-defined thickness adjustment, and a very small amount of used material.

Figure 13:
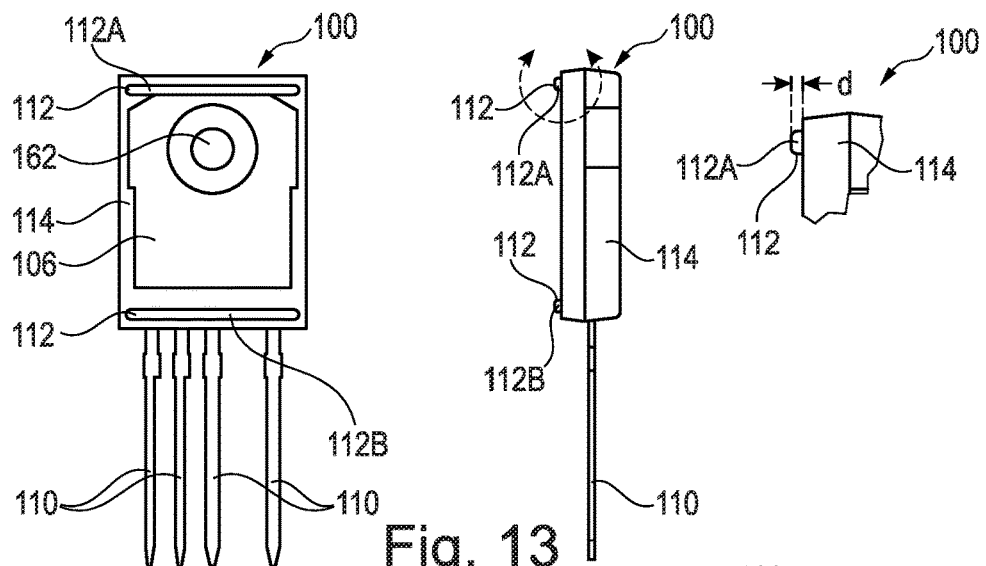
FIG. 13 to FIG. 15 illustrate different views of a package and a corresponding electronic device according to another exemplary embodiment.
Figures 14, 15:
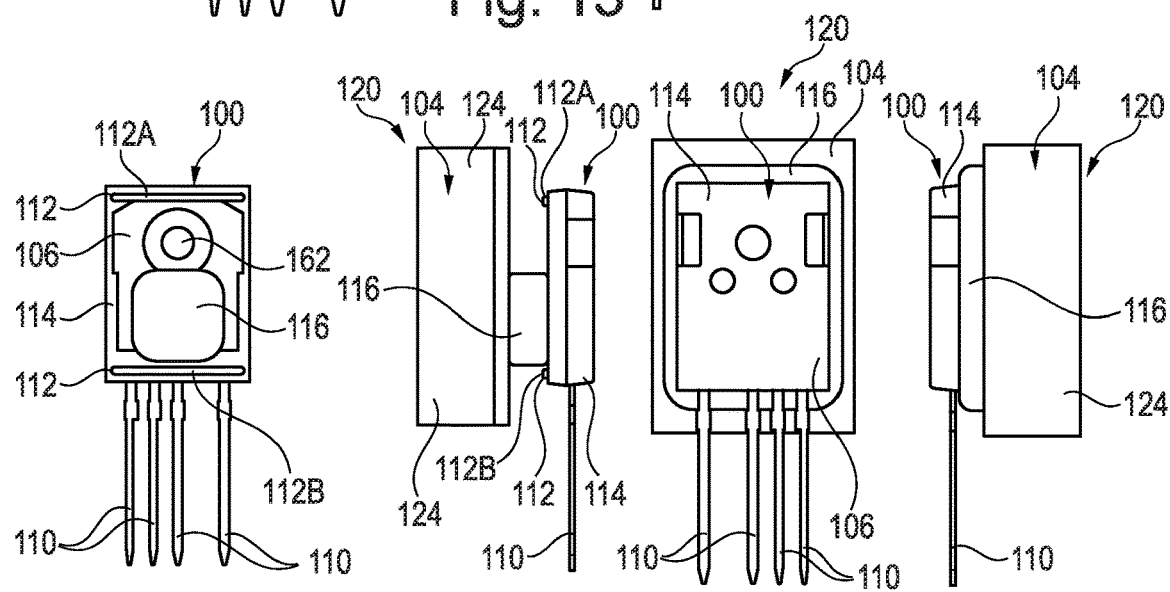

FIG. 13 to FIG. 15 illustrate different views of a package 100 according to another exemplary embodiment. In FIG. 13, different views of package 100 are shown. Referring to FIG. 14, a flowable or viscous precursor of gap filler 116 may be dispensed on the exposed surface of carrier 106 before pressing the package 100 and a heat sink 104 together. FIG. 15 shows the obtained results.

In the above-described embodiments of FIG. 5 to FIG. 12 (as well as in the below described embodiment of FIG. 18 to FIG. 21), leads 110 extend out of the encapsulant 114 at two opposing sides of the respective package 100. In contrast to this, the embodiment of FIG. 13 to FIG. 15 shows a package 100 with leads 110 extending at only one side of the package 100. Furthermore, package 100 according to FIG. 13 to FIG. 15 has a mounting provision 162, such as a through hole, for mounting package 100 on a support or base (not shown). Similar as in FIG. 5 to FIG. 8, package 100 according to a FIG. 13 to FIG. 15 has a linear spacer body 112 embodied as two parallel linearly extending spacer bars or bodies 112A, 112B.

Figures 16, 17:
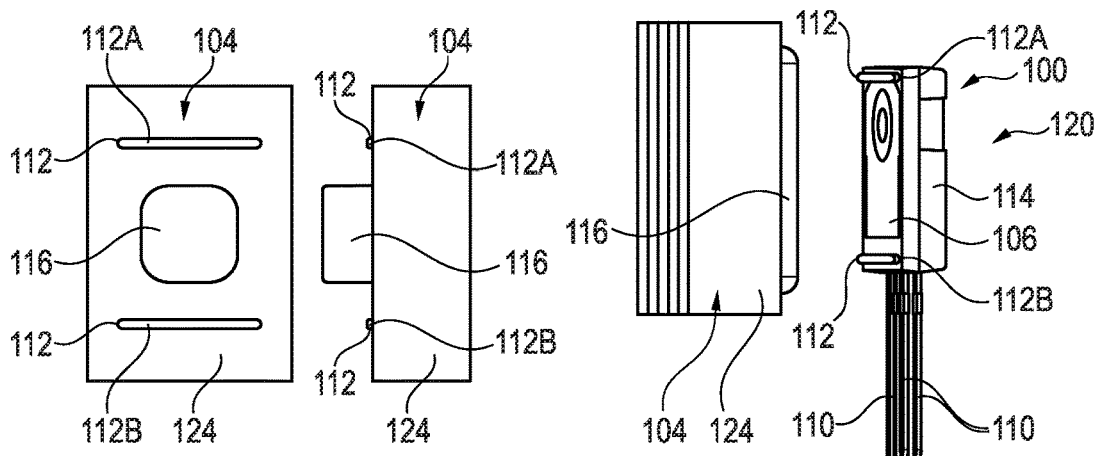
FIG. 16 illustrates different views of a heat sink according to another exemplary embodiment for connection with a package.
FIG. 17 illustrates a package according to another exemplary embodiment for connection with a heat sink.

Referring to FIG. 16, a heat sink 104 according to an exemplary embodiment is shown, in which the heat sink 104 itself (rather than the package 100) is provided with a linear spacer 112 at a connection surface at which the heat sink 104 is to be connected to a package 100 (which may or may not have a linear spacer 112). In the shown embodiment, the linear spacer 112 is embodied as two parallel linear straight spacer bodies 112A, 112B, similar as described for package 100 according to FIG. 13 and FIG. 14. Also according to FIG. 16, spacer bodies 112A, 112B may be made of an electrically insulating material which may be connected with the metallic heat sink material, for instance using an adhesive. A liquid or viscous precursor of filler gap 116 may be applied to the heat sink 104 or to the package 100.

FIG. 17 shows a further embodiment in which again package 100 is provided with a linear spacer 112 in the way as described above referring to FIG. 13. However, flowable material of gap filler 116 is now applied onto a connection surface of heat sink 104 rather than on the package 100 before pressing package 100 and heat sink 104 together.

An advantage of the embodiments of FIG. 13 to FIG. 17 is that the gap filler 116 may be applied with lower effort than a conventionally used thermal interface material (TIM) sheet. Furthermore, these embodiments are compatible with an automated handling of the gap filler 116.

FIG. 18 illustrates different views of a package 100 according to another exemplary embodiment. FIG. 19 illustrates a plan view of an electronic device 120 comprising package 100 according to FIG. 18. FIG. 20 illustrates a side view of the electronic device 120 according to FIG. 19. FIG. 21 illustrates a three-dimensional exploded view of the electronic device 120 according to FIG. 19.

The embodiment of FIG. 18 to FIG. 21 differs from the embodiment of FIG. 5 to FIG. 8 in particular in that, according to the embodiment of FIG. 18 to FIG. 21, the package 100 comprises two electronic components 108 being laterally spaced by a central linear spacer body 112C between lateral spacer bodies 112A, 112B of the spacer 112. Hence, the spacer bar in form of the central linear spacer body 112C extends through a center of the package 100. Thus, the multi-chip package 100 provided with the central linear spacer body 112C spatially separates the adjacent semiconductor chip-type electronic components 108. Therefore, the chips-spacing linear spacer body 112C may increase the creepage distance between the adjacent electronic components 108.

The features of FIG. 18 to FIG. 21 and in particular the bar-shaped linear distance spacer 112 enables a oriented mold-flow in direction to the leads 110. The distance spacer bar (i.e. linear spacer body 112C) between the die-pads serves to increase the isolation of different voltage domains within the package 100. Said distance spacer bar has a height which is easily adjustable to different values for different voltage classes. The distance spacer bars control the isolation layer thickness. Furthermore, the distance spacer bars orient the mold-flow into the preferred direction to ensure a proper lead covering. A gap filler 116 with defined thickness ensures a proper isolation and thermal performance.

Advantages of the embodiment of FIG. 18 to FIG. 21 are a homogeneous pressure distribution, a well-defined thickness adjustment, and a small material usage.

FIG. 22 illustrates an electronic device 120 with a package 100 according to another exemplary embodiment.

According to FIG. 22, the spacer 112 forms part of an intermediate body 122 (such as a grid or frame) arranged between the package 100 and the heat sink 104.

FIG. 23 illustrates an electronic device 120 with a package 100 according to still another exemplary embodiment.

According to FIG. 23, the linear spacer 112 forms part of the heat sink 104, wherein this linear spacer 112 defines a spacing between the carrier 106 and the heat sink 104 when mounted on the package 100.

Figure 24:
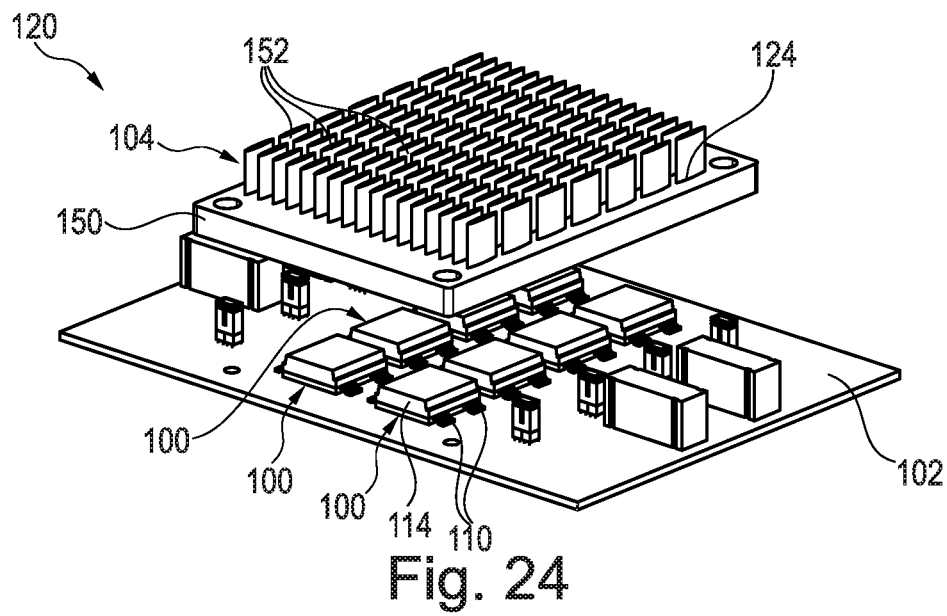
FIG. 24 illustrates an explosion view of an electronic device comprising a package according to an exemplary embodiment and to be mounted between a mounting base and a heat sink.
Figure 25:
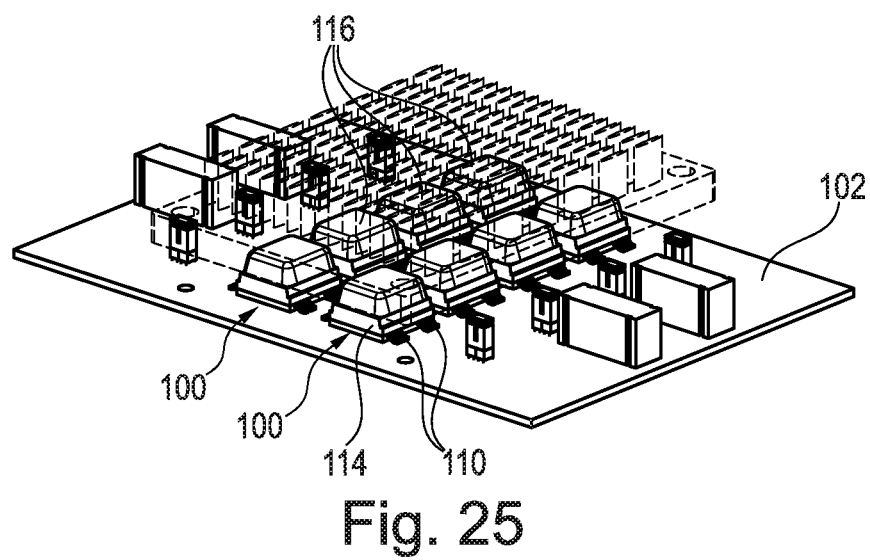
FIG. 25 and FIG. 26 illustrate packages according to exemplary embodiments mounted between on a mounting base before connection with a heat sink via a gap filler.
Figure 26:
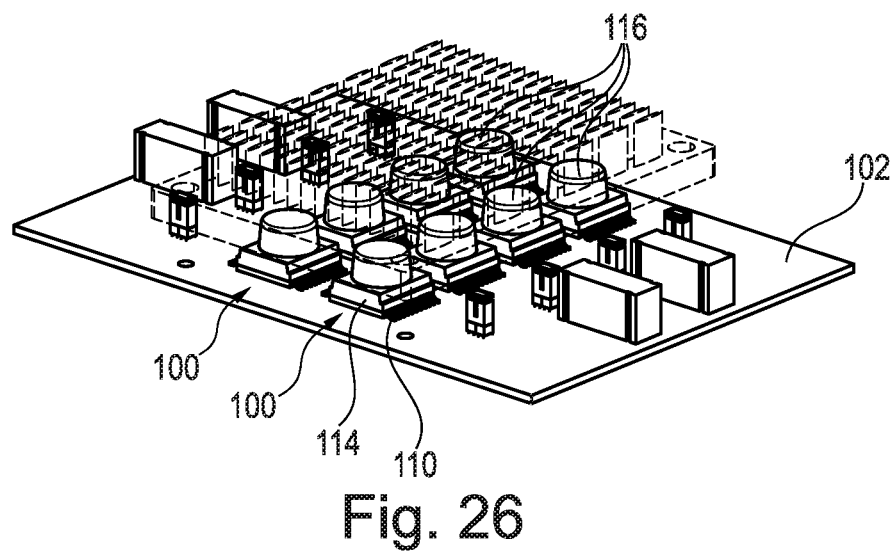

FIG. 24 illustrates an explosion view of an electronic device 120 comprising a package 100 according to an exemplary embodiment and to be mounted between a mounting base 102 and a heat sink 104. FIG. 25 and FIG. 26 illustrate these packages 100 mounted on the mounting base 102 before connection with heat sink 104 by a gap filler 116. According to FIG. 25, cuboid material portions of the gap filler 116 are applied to a top surface of the packages 100. According to FIG. 26, cylindrical material portions of the gap filler 116 are applied to the top surface of the packages 100. Thereafter, the heat sink 104 may be pressed on the portions of gap filler 116 and may distribute gap filler 116 equally over a gap volume between heat sink 104 and packages 100 as defined by the linear spacer 112.

FIG. 27, FIG. 28 and FIG. 29 illustrate different views of a package 100 and a corresponding electronic device 120 according to another exemplary embodiment. FIG. 30 illustrates a heat sink 104 for an electronic device 120 according to an exemplary embodiment for connection with a package 100. FIG. 31 illustrates a package 100 according to another exemplary embodiment for connection with a heat sink 104.

The embodiments of FIG. 27 to FIG. 31 substantially correspond to the embodiments of FIG. 13 to FIG. 17 with the difference that, according to FIG. 27 to FIG. 31, encapsulant 114 fully surrounds the entire carrier 106. Thus, mold compound may contribute to fully surround the complete carrier 106 so that no surface portion of the carrier 106 is exposed according to FIG. 27 to FIG. 31. This may further improve the isolation properties of the package 100 and the corresponding electronic device 120.

What concerns FIG. 27, two distance spacer bars 112 are provided at and extend along two opposing sides of the package 100 for ensuring reinforced isolation. The linear distance bars are based on molding bars so that their height is easily adjustable for different voltage classes (for instance, the height may be adjusted to be 0.2 mm, 0.3 mm, 0.4 mm, or 0.5 mm).

Referring to FIG. 28 to FIG. 30, it is possible to dispense a thermally conductive liquid as gap filler 116 on the package 100 or on the application heat sink 104. Said application heat sink 104 may then be mounted onto the package 100. The application heat sink 104 may be fastened on a mounting base such as a board by using a screw or clip.

FIG. 31 illustrates that the distance spacer 112 controls and defines the isolation layer thickness. During curing the gap filler 116, the liquid is flowing into all four sides of the package 100. The provision of a gap filler 116 with defined thickness ensures reinforced isolation and a proper thermal performance. Simultaneously, a reinforced insulation may be achieved.

It should be noted that the term "comprising" does not exclude other elements or features and the "a" or "an" does not exclude a plurality. Also, elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. An electronic device, comprising:
a package for mounting on a mounting base and for being thermally coupled with a heat sink, wherein the package comprises:
a carrier to be thermally coupled with the heat sink;
an electronic component mounted at the carrier;
leads electrically coupled with the electronic component and to be electrically coupled with the mounting base;
an encapsulant encapsulating at least part of the electronic component, at least part of the carrier, and part of the leads;
wherein a main surface of the package is constituted by a planar area defined by material of the encapsulant and by a surface of the carrier;
a linear spacer which protrudes beyond the planar area;
the heat sink mounted on the package so as to be thermally coupled with the carrier; and
the linear spacer defining a spacing between the carrier and the heat sink.

2. The electronic device according to claim 1, comprising at least one of the following features:
wherein the spacer forms part of one of the group consisting of the package, the heat sink, and an intermediate body arranged between the package and the heat sink; and
comprising the mounting base on which the package is mounted and being electrically coupled with the leads.

3. A method of manufacturing the package of claim 1 for mounting on a mounting base, wherein the method comprises:
mounting an electronic component at a carrier;
electrically coupling leads, to be electrically coupled with the mounting base, with the electronic component; and
providing a linear spacer for defining a spacing with respect to the carrier;
encapsulating at least part of the electronic component, at least part of the carrier, and part of the leads by an encapsulant, so that a main surface of the package is constituted by a planar area defined by material of the encapsulant and by a surface of the carrier; and
wherein the linear spacer protrudes beyond the planar area.

4. The method according to claim 3, wherein the method comprises forming the spacer as part of the encapsulant, in particular by molding, using at least one mold insert.

5. The method according to claim 3, wherein the method comprises forming an electrically insulating and thermally conductive gap filler on an exterior side of the encapsulant encapsulating at least part of the electronic component, at least part of the carrier and part of the leads, and/or on an exterior side of the carrier, and in particular on part of the leads.

6. The method according to claim 5, comprising at least one of the following features:
wherein the method comprises forming the gap filler by applying a flowable or viscous precursor and subsequently hardening the precursor, in particular by heating and/or by a chemical reaction between different constituents of the precursor;
wherein the method comprises dispensing a flowable or viscous precursor of the gap filler on the carrier and/or on the encapsulant, and distributing the flowable or viscous precursor by pressing a heat sink onto the spacer.

7. The electronic device according to claim 1, comprising at least one of the following features:
wherein the linear spacer forms part of the encapsulant;
wherein another part of the carrier is exposed with respect to the encapsulant; and
wherein an extension of the linear spacer extends beyond an extension of the exposed part of the carrier.

8. The electronic device according to claim 1, comprising:
wherein the linear spacer has a vertical extension of at least 30 μm;
wherein the carrier and the leads form part of a common patterned metal plate; and
wherein the linear spacer forms a top end of the package.

9. The electronic device according to claim 1, wherein the linear spacer comprises at least one of the group consisting of at least one straight spacer body, at least one curved spacer body, at least one spacer body extending between a first free end and a second free end, an annularly closed spacer body, and at least two separate linear spacer bodies.

10. The electronic device according to claim 1, wherein the linear spacer comprises at least one spacer bar.

11. The electronic device according to claim 10, comprising at least one of the following features:
wherein at least one of the at least one spacer bar extends through a central region of the package; and
wherein at least one of the at least one spacer bar extends along a periphery of an exposed surface of the carrier.

12. The electronic device according to claim 1, wherein the linear spacer comprises two spacer bars extending along two opposing sides of the package, wherein in particular each of the two spacer bars extends along essentially an entire side of the package.

13. The electronic device according to claim 1, wherein the linear spacer comprises four spacer bars extending along each of all four sides of the package.

14. The electronic device according to claim 13, wherein each of the four spacer bars extends along not more than half of a respective side of the package.

15. The electronic device according to claim 1, comprising at least one of the following features:
wherein the linear spacer is made of an electrically insulating material, in particular a mold compound;
wherein an exterior surface of the carrier and contact areas of the leads, to be electrically coupled with the mounting base, are arranged on opposing sides of the package;
wherein an electrically insulating and thermally conductive gap filler on an exterior side of the carrier and/or on an exterior side of the encapsulant encapsulating at least part of the electronic component, at least part of the carrier and part of the leads, wherein in particular the gap filler covers part of the leads and/or comprises thermally conductive filler particles;
wherein at least part of the carrier is electrically conductive;
wherein an end portion of at least part of the leads is bent away from the carrier; and
wherein at least two electronic components being laterally spaced by at least part of the spacer.

* * * * *